United States Patent [19]

Imai

[11] Patent Number: 5,633,101
[45] Date of Patent: May 27, 1997

[54] MASK AND PROJECTION EXPOSURE METHOD

[75] Inventor: Yuji Imai, Ohmiya, Japan

[73] Assignee: Nikon Corporation, Tokyo, Japan

[21] Appl. No.: 303,667

[22] Filed: Sep. 9, 1994

[30] Foreign Application Priority Data

Sep. 14, 1993 [JP] Japan .................. 5-252386

[51] Int. Cl.⁶ .................................................. G03F 9/00
[52] U.S. Cl. .................. 430/5; 430/322; 430/330; 428/432
[58] Field of Search ................. 430/5, 322, 324, 430/330; 355/52, 53, 76; 428/432

[56] References Cited

U.S. PATENT DOCUMENTS

| 4,080,267 | 3/1978 | Castellani et al. ............. 430/5 |
| 4,448,865 | 5/1984 | Bohlen et al. ................... 430/5 |
| 4,558,949 | 12/1985 | Uehara et al. ................ 356/152 |
| 4,650,983 | 3/1987 | Suwa .............................. 250/204 |
| 4,770,531 | 9/1988 | Griesdorn ..................... 356/358 |
| 5,117,255 | 5/1992 | Shiraishi et al. ............... 355/53 |

FOREIGN PATENT DOCUMENTS 2-235229  9/1990  Japan .
4-225357  8/1992  Japan .

*Primary Examiner*—S. Rosasco
*Attorney, Agent, or Firm*—Shapiro and Shapiro

[57] ABSTRACT

An exposure mask formed with a predetermined pattern for exposure on a substrate to be subjected to exposure comprises a glass substrate and a heat conductive film having a thermal conductivity higher than that of the glass substrate, wherein the heat conductive film is so formed as to cover substantially an entire surface of the glass substrate, and the pattern is so formed as to be in contact with the heat conductive film.

11 Claims, 2 Drawing Sheets

MASK AND PROJECTION EXPOSURE METHOD

BACKGROUND OF THE INVENTION

1. Field of the Invention

The present invention relates to a mask and a projection exposure method utilizing said mask, and more particularly to a photomask for semiconductor device manufacture.

2. Related Background Art

With the recent size reduction in the geometry of patterns of the semiconductor integrated circuits, there has been encountered a drawback, in the projection exposure apparatus, of thermal deformation of the exposure mask (hereinafter simply called "mask") resulting from the absorption of the exposure light and giving rise to a variation in the imaging characteristics.

Particularly in the conventional mask, in which the patterns to be transferred are formed with chromium (chromium oxide film) on the glass substrate, for example heat absorption is higher in the chromium portion constituting the patterns than in the glass portion having higher transmittance to the light. Such heat absorption in the chromium portion has tended to increase in recent years, because a technology to reduce the reflectance of the chromium on the mask has been adopted for avoiding flare in the optical system.

Also, the chromium patterns on the mask are not necessarily distributed uniformly on the mask, but may be localized in the distribution. Such localized distribution may result in localized temperature rise on the mask, eventually leading to anisotropic thermal deformation (non-point symmetrical thermal deformation). Such anisotropic thermal deformation may also result in case only a part of the mask is exposed, as, for example, with a light shielding member (variable field diaphragm). Such anisotropic thermal deformation of the mask may cause an anisotropic distortion in the projected image. For compensating the variation in the imaging characteristics in such case, the correction only for the variation in image magnification is insufficient, and there will also be required the correction for example for the variation in distortion, for example.

As explained in the foregoing, the conventional mask, generating the anisotropic distortion in the projected image because of the thermal deformation, requires not only the correction for the variation in image magnification but also the correction for the variation in distortion etc. The variation in image magnification can in general be securely corrected by the displacement of the optical elements in the projection optical system, but the variation in distortion may be not completely correctable, depending on the mode of deformation of the mask, and generally requires a complex method of correction.

SUMMARY OF THE INVENTION

In consideration of the foregoing, an object of the present invention is to provide an exposure mask capable of avoiding anisotropic deformation resulting from heat absorption of the mask, thereby ensuring satisfactory imaging characteristics only through the correction of the variation in image magnification, and a projection exposure method utilizing said exposure mask.

The above-mentioned object can be attained, according to the present invention, by an exposure mask, bearing thereon predetermined patterns to be projection exposed on a substrate to be subjected to projection exposure, comprising a glass substrate, a heat conductive film having a thermal conductivity substantially higher than that of said glass substrate, being so formed as to cover the substantially an entire surface of said glass substrate and being transmissive to the wavelength of the exposing light, and a pattern layer so formed as to be in contact with said heat conductive film.

In a preferred embodiment of the present invention, said heat conductive film is composed of a conductive material transparent to the wavelength of the exposing light, such as Au, $TiO_2$ or $SnO_2$. Also, said pattern layer is preferably formed on the surface of said glass substrate or on the surface of the heat conductive film formed on said glass substrate.

Also according to the present invention, there is provided a projection exposure method of illuminating an exposure mask with the illuminating light of a predetermined wavelength region and forming an image of the patterns, formed on said exposure mask, through a projection optical system with predetermined imaging characteristics on a substrate to be subjected to projection exposure, wherein said exposure mask comprises a glass substrate, a heat conductive film having a thermal conductivity substantially higher than that of said glass substrate and being so formed as to cover the substantially entire surface of said glass substrate, and a pattern layer so formed as to be in contact with said heat conductive layer, and the variation in said imaging characteristics, due to anisotropic thermal deformation of said exposure mask induced by the absorption of said illuminating light, is substantially avoided.

In the exposure mask of the present invention, in which a thin film of a high thermal conductivity is attached to the glass substrate, the heat generated in the pattern layer by the absorption of the exposing light can be transmitted substantially uniformly to the entire glass substrate through the heat conductive film. Consequently there is not encountered the anisotropic heat distribution where temperature rise takes place only in the vicinity of the pattern layer and scarcely occurs in other glass portions not bearing the patterns. Stated differently, the temperature distribution within the mask becomes uniform or at least isotropic, so that the thermal deformation of the mask resulting from the absorption of the exposing light also becomes isotropic.

Consequently, in the projection exposure method utilizing the exposure mask of the present invention, the variation in the image magnification becomes predominant among the variations in the imaging characteristics resulting from the isotropic thermal deformation of the mask, and the correction for the variation in image magnification only enables projection exposure with satisfactory imaging characteristics.

DESCRIPTION OF THE PREFERRED EMBODIMENTS

Now the present invention will be described in detail with respect to preferred embodiments thereof, and with reference to the attached drawings.

Figure 1:
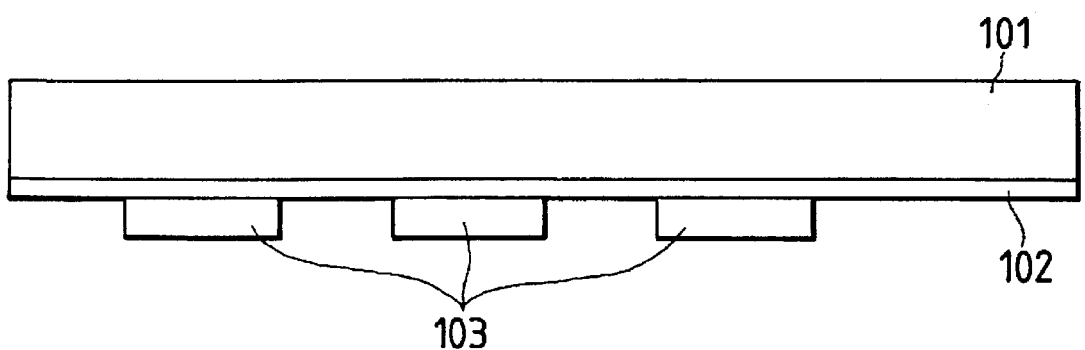
FIG. 1 is a schematic view showing the structure of the exposure mask in a first embodiment of the present invention.

FIG. 1 is a schematic view showing the structure of the exposure mask constituting a first embodiment of the present invention. The mask shown in FIG. 1 is provided with a glass substrate 101, composed for example of quartz glass. On the glass substrate 101, there is formed, over an entire surface thereof, a thin film 102 having a thermal conductivity substantially higher than that of the quartz glass. The thermal conductive film 102 is only required to have the transmittance of a certain level to the exposing (ultraviolet) light, and can be composed, for example, of Au, TiO or $SnO_2$.

Such material as Au, TiO or $SnO_2$ has not only higher thermal conductivity but also higher electrical conductivity than those of quartz glass, since thermal conductivity and electrical conductivity are generally in proportional relationship in metallic substances.

As explained above, the heat conductive film is preferably composed of a material transmissive to the exposing light and having high thermal and electrical conductivity, such as Au, TiO or $SnO_2$.

Such heat conductive film, composed of a material of a higher electrical conductivity than that of the glass substrate of the mask, can provide an effect of preventing electrostatic destruction of the mask patterns. If the heat conductive film is composed of an insulating material, the mask may become charged during the transportation thereof, and the fine edges of the patterns on the mask may be destroyed by such electrostatic charge.

On the heat conductive film 102, a pattern layer 103 is formed, as, for example, with chromic acid.

Figure 2:
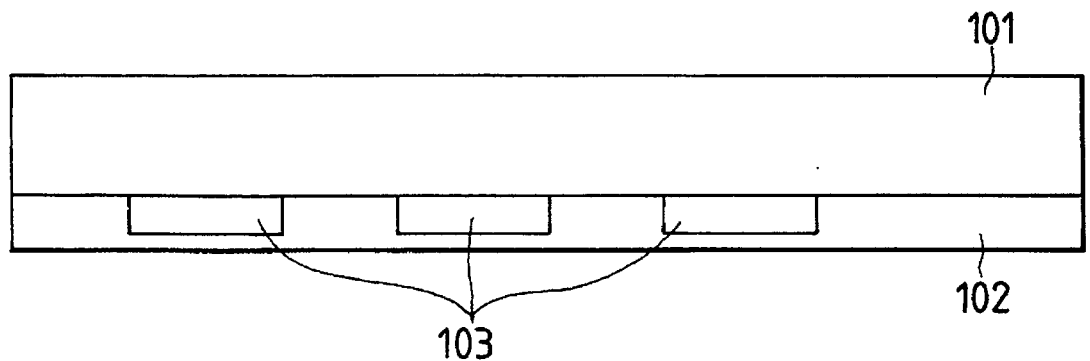
FIG. 2 is a schematic view showing the structure of the exposure mask in a second embodiment of the present invention.

FIG. 2 is a schematic view showing the structure of the exposure mask constituting a second embodiment of the present invention. The mask shown in FIG. 2 is similar, in the structure, to the mask of the first embodiment, but is different in that the pattern layer 103 is formed directly on the glass substrate 101 and the heat conductive film 102 is formed on the glass substrate 101 and the pattern layer 103.

The exposure masks in both embodiments are common in that the heat conductive film 102 is in contact with the pattern layer 103 and covers an entire surface of the glass substrate 101.

Figure 3:
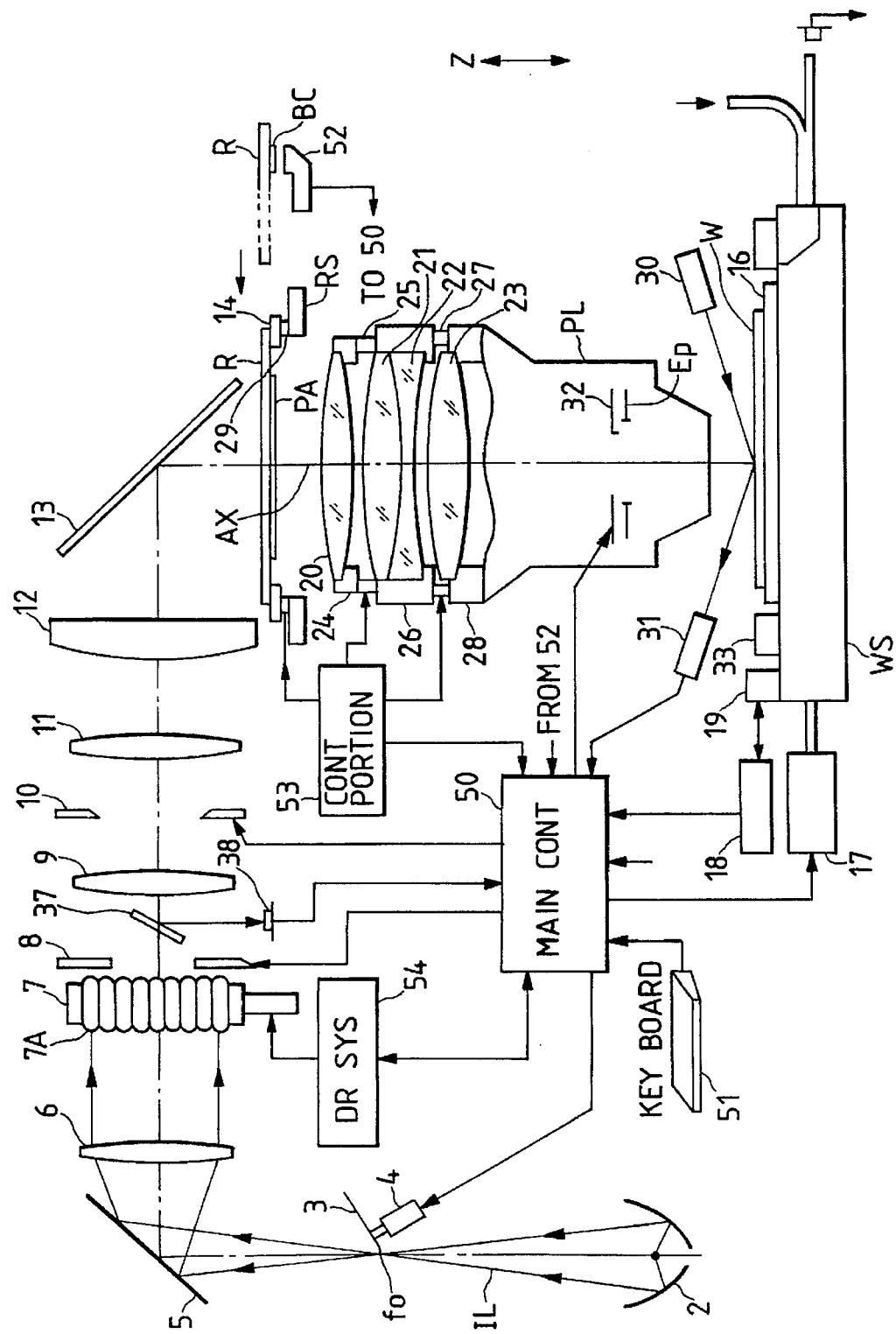
FIG. 3 is a schematic view of a projection exposure apparatus for executing the projection exposure method employing the exposure mask of the present invention.

FIG. 3 is a schematic view of a projection exposure apparatus for executing the projection exposure method of the present invention, utilizing the above-explained exposure mask.

Referring to FIG. 3, an ultra-high pressure mercury lamp 1 emits illuminating light IL of a wavelength region actinic to the photoresist layer, as, for example, of i-line. Such illuminating light for exposure can be obtained not only from the emission spectrum of the ultra-high pressure mercury lamp 1, but also from the light of a KrF or ArF excimer laser or the harmonic wave of a metal vapor laser or a YAG laser, for example. The illuminating light IL is condensed by an elliptical mirror 2 to a second focal point $f_0$ thereof, then guided through a condensing optical system 6, including a mirror 5, a collimating lens etc. and enters an optical integrator (fly's eye lenses) 7A. In the vicinity of the exit plane (focal plane at the reticle side) of said fly's eye lenses 7A, there is provided a variable-aperture diaphragm 8 for varying the numerical aperture $NA_{IL}$ of the illuminating optical system.

The fly's eye lenses 7A are so positioned that the focal plane thereof at the reticle side substantially coincides with a Fourrier transformation plane with respect to the pattern-bearing face of a reticle R provided in the illuminating optical system. The fly's eye lenses 7A are used for effecting ordinary illumination to the reticle, and are composed of an array of plural lens elements, with the center at the optical axis AX, along a plane perpendicular to said optical axis AX. In the vicinity of the second focal point $f_0$ there is provided a shutter 3 (for example, a four-blade rotary shutter) for opening or closing the optical path of the illuminating light IL, by means of a motor 4.

In the present embodiment, though not illustrated, plural sets of fly's eye lenses, including the fly's eye lenses 7A, are provided on a support member (for example, a rotary turret plate) 7, so that an arbitrary set of the fly's eye lenses is interchangeably positioned in the illuminating light path by a driving system 54. Such interchangeable arrangement of plural sets of the fly's eye lenses, in combination with the variable-aperture diaphragm, allows variation of the illuminating conditions (δ-value; ordinary illumination, annular illumination or inclined illumination) according to the kind of the reticle, geometry and periodic nature of the patterns. For effecting inclined illumination, a set of the fly's eye lenses is provided, as disclosed for example in the Japanese Patent Application Laid-open No. 4-225357 (U.S. Ser. No. 791,138 filed on Nov. 13, 1991) with plural (two or four) fly's eye lenses having centers respectively at plural positions deviated from the optical axis AX of the illuminating optical system.

The illuminating light IL emerging from the fly's eye lenses 7A is guided through a half mirror 37, relay lenses 9, 11, a variable blind 10 and a main condenser lens 12, and is reflected substantially vertically downwards by a mirror 13 thereby illuminating a pattern area PA of the reticle R with a substantially uniform illumination intensity. As the plane of the variable blind 10 is in conjugate relationship with the reticle R, the illuminating field of the reticle R can be arbitrarily selected by varying the size and shape of the aperture of said variable blind 10, by driving plural movable blades, constituting said variable blind 10, by means of motors (not shown).

The reticle R is supported by a reticle holder 14, which is in turn placed on a reticle stage RS, rendered two-dimensionally movable in the horizontal plane, by means of plural driving elements 29 capable of telescoping motion (only two of said elements being illustrated in FIG. 3). A driving element control unit 53 is capable, through control of the amount of telescoping of each driving element 29, of causing a parallel displacement of the reticle R in the axial direction of the projection optical system PL and inclining said reticle R in an arbitrary direction, with respect to the plane perpendicular to the optical axis AX. The above-explained configuration allows correction of the imaging characteristics of the projection optical system, particularly barrel- or spool-shaped distortion. The reticle R is so positioned that the center of the pattern area PA thereof coincides with the optical axis AX. Also a light beam from the projection optical system, separated by the half mirror 37, is detected by a photosensor 38.

The illuminating light IL, passing the pattern area PA of the reticle R, enters the projection optical system PL, which is telecentric on both sides. Said projection optical system PL forms a projected image of the circuit patterns of the reticle R in superposition with a shot area of a wafer W, which is formed with a photoresist layer thereon and which is so supported that the surface thereof substantially coincides with the best focal plane. In the present embodiment, a part of the lens elements constituting the projection optical system PL, more specifically lens element 20 and lens elements 21, 22 shown in FIG. 3, are rendered independently drivable by the driving element control unit 53, in order to correct the imaging characteristics, such as projection magnification, distortion etc., of the projection optical system PL, as will be explained in more detail later. The correction of distortion etc. by such driving of the reticle R or the lens elements is disclosed in U.S. Pat. No. 5,117,255. Also, a variable-aperture diaphragm 32 is provided on the pupil plane Ep of the projection optical system PL or in the vicinity thereof, in order to vary the numerical aperture NA of the projection optical system PL.

The wafer W is attached by suction to a wafer holder (θ table) 16, and is supported on a wafer stage WS through said wafer holder 16. Said wafer stage WS can be inclined, by means of a motor 17, in an arbitrary direction with respect to the best focal plane of the projection optical system PL, and can be moved finely in the axial (Z) direction, and can also achieve two-dimensional step-and-repeat movements. Thus, after the transfer exposure of the reticle R to a shot area on the wafer W, the wafer W is stepped to a next shot area. The configuration of such wafer stage WS is disclosed for example in U.S. Pat. No. 4,770,331. At an end of the wafer stage WS, there is fixed a movable mirror 19 for reflecting the laser beam from an interferometer 18, and the two-dimensional position of the wafer stage WS is constantly detected by said interferometer 18, with a resolving power for example of about 0.01 μm.

Also on the wafer stage WS, there is provided a photoelectric sensor 33, as a monitor for the amount of irradiation, at a height substantially coinciding with the surface of the wafer W. The photoelectric sensor 33 is composed of a photoelectric converting element having a light-receiving face of an area approximately equal, for example, to the image field of the projection optical system PL or the projection area of the reticle pattern, and provides a main control unit 50 with optical information relative to said amount of irradiation. Said optical information is used as basic data for determining the amount of variation (amount of aberration) in the imaging characteristics, corresponding to the amount of energy accumulated in the projection optical system PL as a result of entry of the illuminating light.

Also, as shown in FIG. 3, there is provided a wafer position detection system of inclined light beam method, consisting of an illuminating optical system 30 for supplying a light beam, from a direction inclined to the optical axis AX, for forming a pinhole or slit image toward the best focal plane of the projection optical system PL, and a light-receiving optical system 31 for receiving, through a slit, said light beam reflected on the surface of the wafer W. Such a wafer position detection system is described in U.S. Pat. No. 4,650,983, for example, and is used for detecting the vertical position, in the Z-direction, of the wafer surface with respect to the focal plane, thereby enabling driving the wafer stage WS in the Z-direction in such a manner that a predetermined distance is maintained between the wafer W and the projection optical system PL.

In the present embodiment it is assumed that the wafer position detection system is calibrated in advance by an angular adjustment of a parallel-faced flat glass (not shown) provided in the light-receiving optical system 31 in such a manner that a zero point is obtained at the focal plane. It is also assumed that the inclination of a predetermined area on the wafer with respect to the focal plane can be detected, as, for example, by a horizontal position detecting system as disclosed in U.S. Pat. No. 4,558,949 or such construction of the wafer position detection system as to detect the focal positions at arbitrary plural positions within the image field of the projection optical system PL (for example, by forming plural slit images within the image field).

In FIG. 3 there are further illustrated a main control unit 50 for controlling the entire apparatus, a bar code reader 52 for reading a bar code BC, provided at a side of the reticle pattern, in the course of transportation of the reticle R to the position above the projection optical system PL, a keyboard 51 used by the operator for entering various commands and data, and a drive system 54, consisting of motors, gear trains etc., for driving the support member 7 on which are fixed the plural sets of the fly's eye lenses, including the fly's eye lenses 7A.

In the main control unit 50, there are registered, in advance, the names of the plural reticles to be handled in this projection exposure apparatus (for example, a stepper) and the operation parameters of the stepper corresponding to each registered name. When the bar code reader 52 reads the bar code BC of the reticle R, the main control unit 50 selects a set of fly's eye lenses, best matching the illuminating condition (corresponding to the kind of reticle and the periodic character of the reticle pattern) registered in advance as one of the operating parameters corresponding to thus read name, from those on the support member 7 and supplies the drive system 54 with a predetermined drive command.

Also, as the operating parameters corresponding to the above-mentioned name, there are registered, in relation to thus selected set of the fly's eye lenses, the optimum setting conditions of the variable-aperture diaphragms 8, 32 and of the variable blind 10, and the calculation parameters for correcting the imaging characteristics of the projection optical system PL by a correcting mechanism to be explained later, and these conditions are also set simultaneously with the setting of the fly's eye lenses. In this manner there is set an optimum illuminating condition for the reticle R placed on the reticle stage RS. The above-mentioned operations can also be achieved by the operator through input of commands and data from the keyboard 51 into the main control unit 50.

In the following there will be explained the correcting mechanism for the imaging characteristics of the projection optical system PL. In the present embodiment, as shown in FIG. 3, the imaging characteristics of the projection optical system PL can be corrected by independent drive of the reticle R, lens element 20 and lens elements 21, 22 through the driving element control unit 53. The imaging characteristics of the projection optical system PL include focal position, projection magnification, image distortion, image plane curvature, astigmatism etc., and, though it is possible to correct these parameters individually, there will be explained in the following, for the purpose of simplicity, the correction of the focal position, projection magnification, distortion and image plane curvature in a projection optical system telecentric on both sides. In the present embodiment, the barrel- or spool-shaped distortion is corrected by the displacement of the reticle R.

The lens element 20 of a first group closest to the reticle R is fixed to a support member 24, while the lens elements 21, 22 of a second group are integrally fixed to a support member 26. The lens element 23 and lower ones are fixed to a lens barrel 28 of the projection optical system PL. In the present embodiment, the optical axis AX of the projection optical system PL indicates that of the lens elements fixed to said lens barrel 28.

The support member 24 is connected, by telescoping plural driving elements 25 (for example three elements being provided, of which two are illustrated), to the support member 26, which is in turn connected, by telescoping plural driving elements 27 to the lens barrel 28. The driving elements 25, 27, 29 are composed for example of electrostrictive or magnetostrictive elements, and the amount of deformation of each driving element corresponding to the voltage or the magnetic field given thereto is determined in advance. In consideration of the hysteresis of the driving elements, an unrepresented position detector such as a capacitative displacement sensor or a differential transformer is provided on each driving element for monitoring the position thereof corresponding to the voltage or the magnetic field supplied thereto, thereby enabling highly precise drive.

Respective parallel displacements of the lens element 20 and the lens elements 21, 22 in the axial direction cause variations in the projection magnification M, the image plane curvature C and the focal position F with rates corresponding to the amounts of said displacements. For an amount $x_1$ of displacement of the lens element 20 and an amount $x_2$ of displacement of the lens elements 21, 22, the amounts of variation $\Delta M$, $\Delta C$ and $\Delta F$ respectively in the projection magnification M, image plane curvature C and focal position F can be respectively represented by the following formulas (1) to (3):

$$\Delta M = C_{M1} \times x_1 + C_{M2} \times x_2 \quad (1)$$

$$\Delta C = C_{C1} \times x_1 + C_{C2} \times x_2 \quad (2)$$

$$\Delta F = C_{F1} \times x_1 + C_{F2} \times x_2 \quad (3)$$

wherein $C_{M1}$, $C_{M2}$, $C_{C1}$, $C_{C2}$, $C_{F1}$ and $C_{F2}$ are constants representing rates of variations relative to the amount of displacement of the lens element.

As explained in the foregoing, the wafer position detection system 30, 31 is provided to detect the amount of displacement of the wafer surface, with respect to the optimum focal position of the projection optical system PL as the zero point. Consequently, by giving a suitable optical or electrical offset $x_3$ to the wafer position detection system 30, 31 and by positioning the wafer surface with said system 30, 31, it is rendered possible to correct the aberration in the focal position resulting from the drive of the lens element 20 and of the lens elements 21, 22. In this situation, the formula (3) can be transformed as follows:

$$\Delta F = C_{F1} \times x_1 + C_{F2} \times x_2 + x_3 \quad (4)$$

Similarly, a parallel displacement of the reticle R in the axial direction causes variations in the distortion D and the focal position F, with rates corresponding to the amount of displacement. For a displacement amount $x_4$ of the reticle R, the amounts of variation $\Delta D$, $\Delta F$ respectively of the distortion D and the focal position F are respectively represented by the following formulas (5) and (6):

$$\Delta D = C_{D4} \times x_4 \quad (5)$$

$$\Delta F = C_{F1} \times x_1 + C_{F2} \times x_2 + x_3 + C_{F4} \times x_4 \quad (6)$$

wherein $C_{D4}$ and $C_{F4}$ are constants representing rates of variations relative to the amount of drive of the reticle R.

Based on the foregoing, it is possible to arbitrarily correct the amounts of variation $\Delta M$, $\Delta C$, $\Delta D$ and $\Delta F$ by suitable setting of the drive amounts $x_1$ to $x_4$ in the formulas (1), (2), (5) and (6).

In the foregoing there have been explained simultaneous corrections of four imaging characteristics, but such corrections become unnecessary if the variations in the imaging characteristics resulting from the absorption of the illuminating light are negligible within the imaging characteristics of the projection optical system. On the other hand, if there is a significant variation in the imaging characteristic other than those four, correction has to be made for such varying imaging characteristic. In the present embodiment, no particular correction is made for the astigmatism, since the variation thereof can be maintained within the tolerance by the correction of the image plane curvature within the tolerance.

In the present embodiment, with respect to the variation $\Delta F$ of the focal position (formula (6)), the surface of the wafer W is set at the best focal plane of the protection optical system PL by giving said amount of variation $\Delta F$ as an optical or electrical offset to the wafer position detection system 30, 31 and utilizing said system 30, 31 for moving the wafer W in the Z-direction.

Also in the present embodiment, the correcting mechanism for the imaging characteristics achieves corrections by the displacements of the reticle R and the lens elements, but there may be employed a suitable correcting mechanism of any other principle. For example, there may be adopted a method of controlling the pressure of a space enclosed between two lens elements, as disclosed in U.S. Pat. No. 4,871,237.

In the present embodiment, the reticle R and the lens elements 20 and the lens elements 21, 22 are rendered movable by the driving element control unit 53, and such arrangement facilitates control because said lens elements 20 and the lens elements 21, 22 have larger influence on the projection magnification, distortion and image plane curvature (astigmatism), in comparison with other lens elements. Also in the present embodiment, the movable lens elements are formed as two groups, but there may also be employed three or more groups. In such case it is rendered possible to select a larger range of movement of the lens elements while preventing variations in other aberrations, and to cope with distortions of various shapes (for example, trapezoidal or rhombic) and image plane curvature (astigmatism). The use of the correction mechanism of the above-explained configuration makes it possible to sufficiently cope with the variations in the imaging characteristics of the projection optical system PL, resulting from the absorption of the exposing light.

Based on the above-explained configuration, the driving element control unit 53 can move, according to the driving commands supplied from the main control unit 50, three or four points of the periphery of the lens element 20 and the lens elements 21, 22 and reticle R independently in the axial direction. As a result, each of the lens element 20 and the lens elements 21, 22 and reticle R can be displaced in parallel manner in the axial direction and/or inclined in an arbitrary direction with respect to the plane perpendicular to the optical axis AX.

Also the eccentricity of the exposure mask, resulting from the expansion of the entire mask, can be corrected by a shift of the reticle stage or the wafer stage.

As already explained in the foregoing, in the exposure mask shown in FIGS. 1 and 2, the heat generated in the pattern layer by the absorption of the exposing light can be substantially uniformly transmitted to the entire glass substrate through the heat conductive film. Consequently the temperature distribution within the mask becomes uniform or at least isotropic, so that the thermal deformation of the mask resulting from the absorption of the exposing light also becomes isotropic.

Therefore, in the use of the exposure mask of the present invention, the variation in the image magnification becomes predominant among the variations in the imaging characteristics resulting from isotropic thermal deformation of the mask, and the variations in other imaging characteristics, such as distortion, are limited. Consequently, in the projection exposure method of the present invention utilizing, for example, the projection exposure apparatus of the above-explained configuration, it is rendered possible to effect projection exposure with satisfactory imaging characteristics, through the correction of the variation in magnification only. It is naturally possible to obtain further improved imaging characteristics by correcting the slight variations in other imaging characteristics, such as in distortion, by the correcting mechanism explained above.

The amount of the variation in image magnification to be corrected can be determined by optically measuring the temperature of the exposure mask (for example, with an infrared camera) and effecting numerical calculations based on thus measured temperature distribution. Said amount of correction can be determined also by monitoring the amount of irradiation on the exposure mask (for example, with the photo-sensor 38), then numerically calculating the temperature distribution based on the temperature characteristics of the reticle and effecting numerical calculations based on thus calculated temperature distribution. It is furthermore possible to determine the amount of correction by preparing, in advance, a table of experimental relationship between the amount or time of irradiation of the mask and the amount of variation in magnification, and referring to this table. In case the illuminating condition is varied by the drive of the aforementioned support member 7, the above-mentioned table can be prepared for each illuminating condition.

Furthermore, by taking the thermal conduction time of the exposure mask into consideration and by effecting the projection exposure after the temperature distribution of the mask reaches a sufficiently uniform state, satisfactory imaging characteristics can be attained with only the correction of the variation in image magnification.

As explained in the foregoing, the temperature distribution of the mask, resulting from the absorption of the illuminating light, becomes isotropic regardless of the patterns present on said mask, so that the thermal deformation of the mask also becomes isotropic. Consequently the pattern transfer can be achieved with a high precision, and with satisfactory imaging characteristics, by the simple correction of the variation in image magnification, resulting from isotropic thermal deformation of the mask, and the precision of alignment of images is particularly significantly improved.

What is claimed is:

1. In a projection exposure apparatus having an illumination optical system for illuminating a mask, formed with a pattern, with illuminating light of a predetermined wavelength region, and a projection optical system for forming an image of the pattern onto a substrate to be subjected to exposure, the improvement wherein:

said mask comprises a glass substrate, and a heat conductive film transmissive to the illuminating light and having a thermal conductivity higher than that of said glass substrate;

said heat conductive film is so formed as to cover substantially an entire surface of said glass substrate, and said pattern is so formed as to cover a portion of said surface and to be in contact with said heat conductive film, said heat conductive film producing an isotropic temperature distribution within said mask such that thermal deformation of said mask due to absorption of said illuminating light becomes isotropic; and a correction system is provided that corrects for variation of an imaging characteristic of said projection optical system due to said thermal deformation of said mask.

2. The improvement of claim 1, wherein said heat conductive film is substantially transparent to the predetermined wavelength region of the illuminating light.

3. The improvement of claim 2, wherein said heat conductive film is composed of Au, TiO or $SnO_2$.

4. The improvement of claim 1, wherein said pattern is formed between said surface of said glass substrate and said heat conductive film.

5. The improvement of claim 1, wherein said pattern is formed on said heat conductive film, and said heat conductive film is formed on said surface of said glass substrate.

6. A projection exposure method for illuminating a mask with illuminating light of a predetermined wavelength region, thereby forming an image of a pattern, formed on said mask, through a projection optical system onto a substrate to be subjected to exposure, wherein:

said mask comprises a glass substrate, and a heat conductive film transmissive to the illuminating light and having a thermal conductivity higher than that of said glass substrate, wherein said heat conductive film is so formed as to cover substantially an entire surface of said glass substrate and said pattern is so formed as to cover a portion of said surface and to be in contact with said heat conductive film, said heat conductive film producing an isotropic temperature distribution within said mask such that thermal deformation of said mask due to absorption of said illuminating light becomes isotropic; and correction is effected for variation of an imaging characteristic of said projection optical system generated due to said thermal deformation of said mask.

7. A method according to claim 6, wherein said imaging characteristic of the projection optical system is image magnification.

8. A method according to claim 6, wherein said heat conductive film is substantially transparent to the predetermined wavelength region of the illuminating light.

9. A method according to claim 8, wherein said heat conductive film is composed of Au, TiO or $SnO_2$.

10. A method according to claim 6, wherein said pattern is formed between said surface of said glass substrate and said heat conductive film.

11. A method according to claim 6, wherein said pattern is formed on said heat conductive film, and said heat conductive film is formed on said surface of said glass substrate.

* * * * *